United States Patent
Nygren et al.

(10) Patent No.: US 11,854,602 B2
(45) Date of Patent: Dec. 26, 2023

(54) READ CLOCK START AND STOP FOR SYNCHRONOUS MEMORIES

(71) Applicant: Advanced Micro Devices, Inc., Santa Clara, CA (US)

(72) Inventors: Aaron John Nygren, Boise, ID (US); Karthik Gopalakrishnan, Cupertino, CA (US); Tsun Ho Liu, Boston, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/850,658

(22) Filed: Jun. 27, 2022

(65) Prior Publication Data
US 2023/0176786 A1 Jun. 8, 2023

Related U.S. Application Data

(60) Provisional application No. 63/287,151, filed on Dec. 8, 2021.

(51) Int. Cl.
*G06F 12/00* (2006.01)
*G11C 11/4076* (2006.01)
(Continued)

(52) U.S. Cl.
CPC ............ *G11C 11/4076* (2013.01); *G06F 1/08* (2013.01); *G06F 1/10* (2013.01); *G06F 3/0604* (2013.01);
(Continued)

(58) Field of Classification Search
CPC ......... G11C 11/4076; G06F 1/08; G06F 1/10; G06F 3/0604; G06F 3/0659; G06F 3/0671; G06F 1/3275
See application file for complete search history.

(56) References Cited

U.S. PATENT DOCUMENTS 10,482,921 B2 11/2019 Dietrich
2005/0220232 A1 10/2005 Kunnari et al.
(Continued)

OTHER PUBLICATIONS

International Search Report and Written Opinion for International Application No. PCT/US2022/051419 dated Apr. 6, 2023, 7 pages.
(Continued)

*Primary Examiner* — Shawn X Gu
*Assistant Examiner* — Mohammad S Hasan
(74) *Attorney, Agent, or Firm* — Polansky & Associates, P.L.L.C.; Paul J. Polansky; Nathan H. Calvert

(57) ABSTRACT

A memory controller monitors memory command selected for dispatch to the memory and sends commands controlling a read clock state. A memory includes a read clock circuit and a mode register. The read clock circuit has an output for providing a hybrid read clock signal in response to a clock signal and a read clock mode signal. The mode register provides the read clock mode signal in response to a read clock mode, wherein the read clock circuit provides the hybrid read clock signal as a free-running clock signal that toggles continuously when the read clock mode is a first mode, and as a strobe signal that is active only in response to the memory receiving a read command when the read clock mode is a second mode.

20 Claims, 9 Drawing Sheets

(51) Int. Cl.
　　　*G06F 1/08*　　　(2006.01)
　　　*G06F 1/10*　　　(2006.01)
　　　*G06F 3/06*　　　(2006.01)

(52) U.S. Cl.
　　　CPC ......... *G06F 3/0659* (2013.01); *G06F 3/0671*
　　　　　　　　　　　　　　　　　　　　　　　　(2013.01)

(56) References Cited

U.S. PATENT DOCUMENTS

| | | | |
|---|---|---|---|
| 2006/0197553 A1* | 9/2006 | Fibranz | G11C 11/4076 326/41 |
| 2009/0009618 A1* | 1/2009 | Hasegawa | H04N 25/745 348/222.1 |
| 2010/0313055 A1* | 12/2010 | Honda | G06F 1/10 713/400 |
| 2012/0051161 A1 | 3/2012 | Grunzke | |
| 2012/0300563 A1 | 11/2012 | Kim et al. | |
| 2013/0223167 A1 | 8/2013 | Koshizuka | |
| 2016/0365135 A1 | 12/2016 | Gopalan et al. | |
| 2017/0345482 A1* | 11/2017 | Balakrishnan | G06F 3/0634 |
| 2018/0136843 A1 | 5/2018 | Lee et al. | |
| 2020/0020368 A1 | 1/2020 | Yoon | |
| 2020/0020380 A1 | 1/2020 | Shin et al. | |
| 2020/0027495 A1* | 1/2020 | Takahashi | G11C 7/1066 |
| 2020/0267032 A1 | 8/2020 | Hollis et al. | |
| 2020/0321044 A1 | 10/2020 | Gopalan et al. | |
| 2021/0234733 A1 | 7/2021 | Lin et al. | |
| 2022/0035566 A1* | 2/2022 | Henze | G06F 3/0659 |
| 2022/0407506 A1* | 12/2022 | Fiedler | G06F 1/10 |
| 2023/0081557 A1* | 3/2023 | Kang | G11C 11/40615 365/27 |

OTHER PUBLICATIONS

"GDDR6: The Next-Generation Graphics DRAM"; Technical Note; Rev. A; Nov., 2017; Micron; 8000 S. Federal Way, Boise, ID 83707, U.S.; 22 pages.

* cited by examiner

300

| OP code | Function | OP code Value | Description |
|---|---|---|---|
| [1:0] | RCKMODE | 00b<br>01b<br>10b<br>11b | Disabled (default)<br>Read Only<br>Always Running<br>RSVD |
| [2] | RCKTYPE | 0b<br>1b | Single Ended (default)<br>Differential |
| [4:3] | RCKPRE_Static | 00b<br>01b<br>10b<br>11b | 0<br>2<br>4<br>6 |
| [5] | RCKLEVEL | 0b<br>1b | +3/-3<br>+1/-1 |
| [7:6] | RCKPRE_HS | 00b<br>01b<br>10b<br>11b | 0<br>2<br>4<br>6 |
| [8] | RFU | | |
| [10:9] | RCKPRE_LS | 00b<br>01b<br>10b<br>11b | 0<br>1<br>2<br>3 |
| [11] | RFU | | |

*FIG. 3*

READ CLOCK START AND STOP FOR SYNCHRONOUS MEMORIES

CROSS-REFERENCE TO RELATED, COPENDING APPLICATIONS

Related subject matter is found in U.S. patent application Ser. No. 17/854,924, filed Jun. 30, 2022, invented by the inventors hereof Aaron John Nygren, Michael Litt, Karthik Gopalakrishnan and Tsun Ho Liu and assigned to the assignee hereof; U.S. patent application Ser. No. 17/850,299, filed Jun. 27, 2022, invented by Aaron John Nygren, Karthik Gopalakrishnan and Tsun Ho Liu and assigned to the assignee hereof; and U.S. patent application Ser. No. 17/850,499, filed Jun. 27, 2022, invented by Aaron John Nygren, Karthik Gopalakrishnan and Tsun Ho Liu and assigned to the assignee hereof.

BACKGROUND

Modern dynamic random-access memory (DRAM) provides high memory bandwidth by increasing the speed of data transmission on the bus connecting the DRAM and one or more data processors, such as graphics processing units (GPUs), central processing units (CPUs), and the like. DRAM is typically inexpensive and high density, thereby enabling large amounts of DRAM to be integrated per device. Most DRAM chips sold today are compatible with various double data rate (DDR) DRAM standards promulgated by the Joint Electron Devices Engineering Council (JEDEC). Typically, several DDR DRAM chips are combined onto a single printed circuit board substrate to form a memory module that can provide not only relatively high speed but also scalability.

DDR DRAMs are synchronous because they operate in response to a free-running clock signal that synchronizes the issuance of commands from the host processor to the memory and therefore the exchange of data between the host processor and the memory. DDR DRAMs are responsive to the clock signal to synchronize commands and can be used to generate read data strobe signals. For example, DDR DRAMs receive write data using a center-aligned data strobe signal known as "DQS" provided by the host processor, in which the memory captures data on both the rising and falling edges of DQS. Similarly, DDR DRAMs provide read data synchronously with an edge-aligned DQS in which the DDR DRAMs provide the DQS signal. During read cycles, the host processor delays the DQS signal internally to align it with the center portion of the DQ signals generally by an amount determined at startup by performing data eye training. Some DDR DRAMs, such as graphics DDR, version six (GDDR6) DRAMs receive both a main clock signal and a separate write clock signal and programmably generate a read data strobe signal.

However, while these enhancements have improved the speed of DDR memory used for computer systems' main memory, further improvements are desirable.

BRIEF DESCRIPTION OF THE DRAWINGS

FIG. 3 illustrates in table showing a mode register setting for the receive clock modes of the memory of FIG. 2.

DETAILED DESCRIPTION OF ILLUSTRATIVE EMBODIMENTS

A memory controller includes a command queue, an arbiter, and a read clock control circuit. The command queue includes a plurality of entries for holding incoming memory access commands. The arbiter is for selecting commands from the command queue for dispatch to a memory. The read clock control circuit is for monitoring read commands selected for dispatch to the memory, and responsive to a designated condition, commanding the memory to change a state of a read clock from a first state in which the read clock remains active following a postamble period for a read command, to a second state in which the read clock becomes inactive following the postamble period.

A method includes, at a memory controller, selecting memory access commands and dispatching them to a memory. The method monitors read commands selected for dispatch to the memory, and responsive to a designated condition, commanding the memory to change a state of a read clock from a first state in which the read clock remains active following a postamble period for a read command, to a second state in which the read clock becomes inactive following the postamble period.

A data processing system includes a memory and an integrated circuit including a data processor and a memory controller coupled to the data processor and the memory. The memory controller includes a command queue, an arbiter, and a read clock control circuit. The command queue includes a plurality of entries for holding incoming memory access commands. The arbiter is for selecting commands from the command queue for dispatch to a memory. The read clock control circuit is for monitoring read commands selected for dispatch to the memory, and responsive to a designated condition, commanding the memory to change a state of a read clock from a first state in which the read clock remains active following a postamble period for a read command, to a second state in which the read clock becomes inactive following the postamble period.

According to various embodiments disclosed herein, a memory provides the capability to start and stop the read clock (RCK) that the memory provides to the memory controller based on the commands provided to the memory. Moreover, this behavior can be programmably enabled and disabled based on the value of one or more bits of a mode register.

Figure 1:
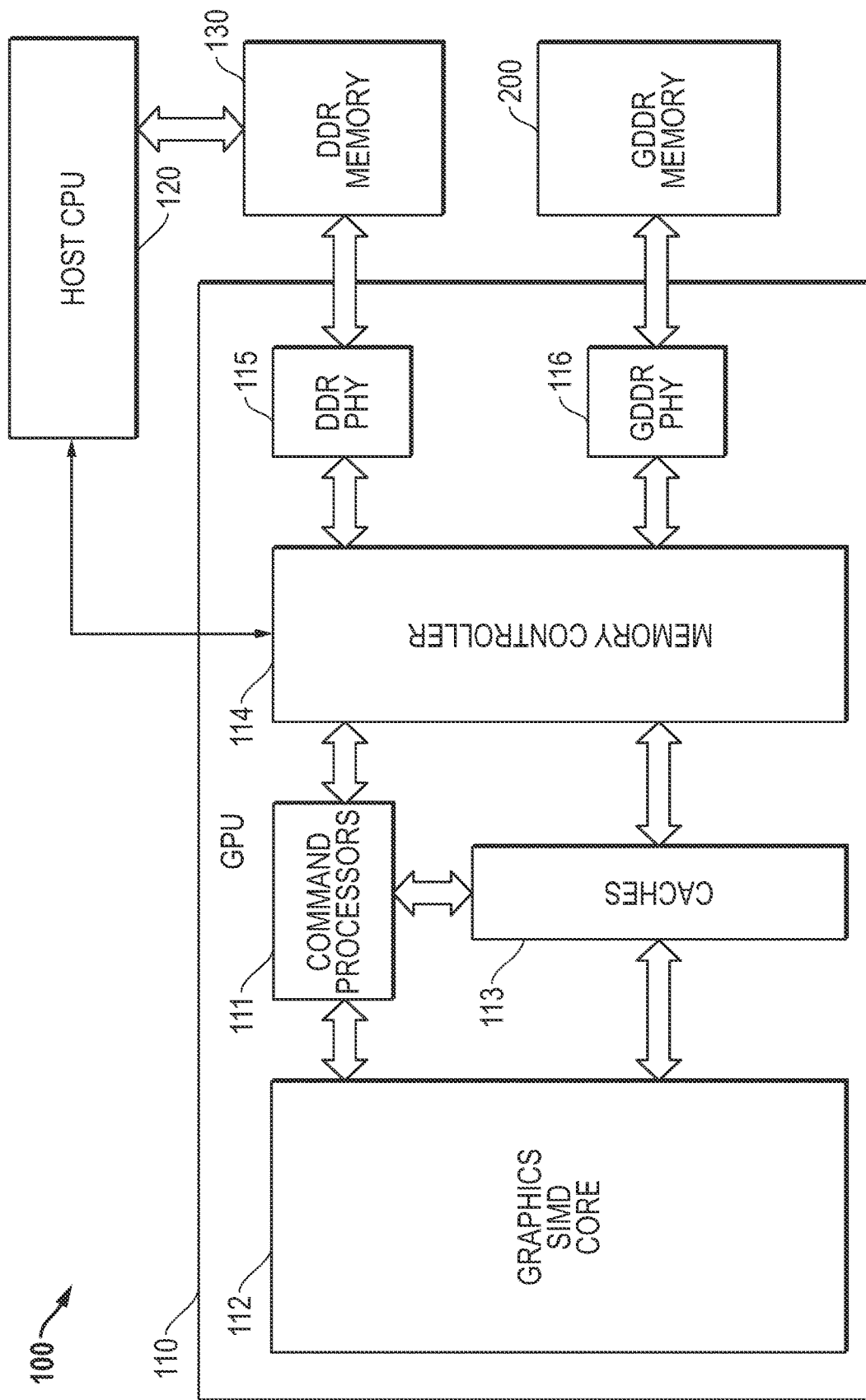
FIG. 1 illustrates in block diagram for a data processing system according to some embodiments.

FIG. 1 illustrates in block diagram for a data processing system 100 according to some embodiments. Data processing system 100 includes generally a data processor in the form of a graphics processing unit (GPU) 110, a host central processing unit (CPU) 120, a double data rate (DDR) memory 130, and a graphics DDR (GDDR) memory 140.

GPU 110 is a discrete graphics processor that has extremely high performance for optimized graphics processing, rendering, and display, but requires a high memory bandwidth for performing these tasks. GPU 110 includes generally a set of command processors 111, a graphics single instruction, multiple data (SIMD) core 112, a set of caches 113, a memory controller 114, a DDR physical interface circuit (PHY) 115, and a GDDR PHY 116.

Command processors 111 are used to interpret high-level graphics instructions such as those specified in the OpenGL programming language. Command processors 111 have a bidirectional connection to memory controller 114 for receiving the high-level graphics instructions, a bidirectional connection to caches 113, and a bidirectional connection to graphics SIMD core 112. In response to receiving the high-level instructions, command processors 111 issue SIMD instructions for rendering, geometric processing, shading, and rasterizing of data, such as frame data, using caches 113 as temporary storage. In response to the graphics instructions, graphics SIMD core 112 executes the low-level instructions on a large data set in a massively parallel fashion. Command processors 111 use caches 113 for temporary storage of input data and output (e.g., rendered and rasterized) data. Caches 113 also have a bidirectional connection to graphics SIMD core 112, and a bidirectional connection to memory controller 114.

Memory controller 114 has a first upstream port connected to command processors 111, a second upstream port connected to caches 113, a first downstream bidirectional port, and a second downstream bidirectional port. As used herein, "upstream" ports are on a side of a circuit toward a data processor and away from a memory, and "downstream" ports are on a side if the circuit away from the data processor and toward a memory. Memory controller 114 controls the timing and sequencing of data transfers to and from DDR memory 130 and GDDR memory 140. DDR and GDDR memory support asymmetric accesses, that is, accesses to open pages in the memory are faster than accesses to closed pages. Memory controller 114 stores memory access commands and processes them out-of-order for efficiency by, e.g., favoring accesses to open pages, disfavoring frequent bus turnarounds from write to read and vice versa, while observing certain quality-of-service objectives.

DDR PHY 115 has an upstream port connected to the first downstream port of memory controller 114, and a downstream port bidirectionally connected to DDR memory 130. DDR PHY 115 meets all specified timing parameters of the implemented version or versions of DDR memory 130, such as DDR version five (DDR5), and performs training operations at the direction of memory controller 114. Likewise, GDDR PHY 116 has an upstream port connected to the second downstream port of memory controller 114, and a downstream port bidirectionally connected to GDDR memory 200. GDDR PHY 116 meets all specified timing parameters of the implemented version of GDDR memory 140, such as GDDR version seven (GDDR7), and performs training operations at the direction of memory controller 114.

The inventors have discovered that the read clock (RCK) that the memory, e.g., GDDR memory 200, provides to GDDR PHY 116 can be programmed to operate in certain new and advantageous ways. According to some embodiments, the memory has a "read-only" mode. In the read-only mode, the memory provides the RCK signal with read commands in which it causes the RCK signal to start toggling during a read preamble period before a data transmission of a read command, and to continue to toggle at least to the end of a read postamble period following the read command. The read-only mode provides the ability to reduce power consumption during workloads in which read operations are or can be infrequent.

GDDR memory 200 also has an "always on" mode. In the always-on mode, GDDR memory 200 provides the RCK signal continuously as long as a write clock (WCK) is received from the host, e.g., the memory controller or memory PHY of a host processor chip. The always on mode provides the ability for the host processor PHY to stay locked and avoid the need for resynchronization during a preamble period.

According to some embodiments, the memory further has a disabled mode in which the memory does not provide any read clock signal.

Figure 2:
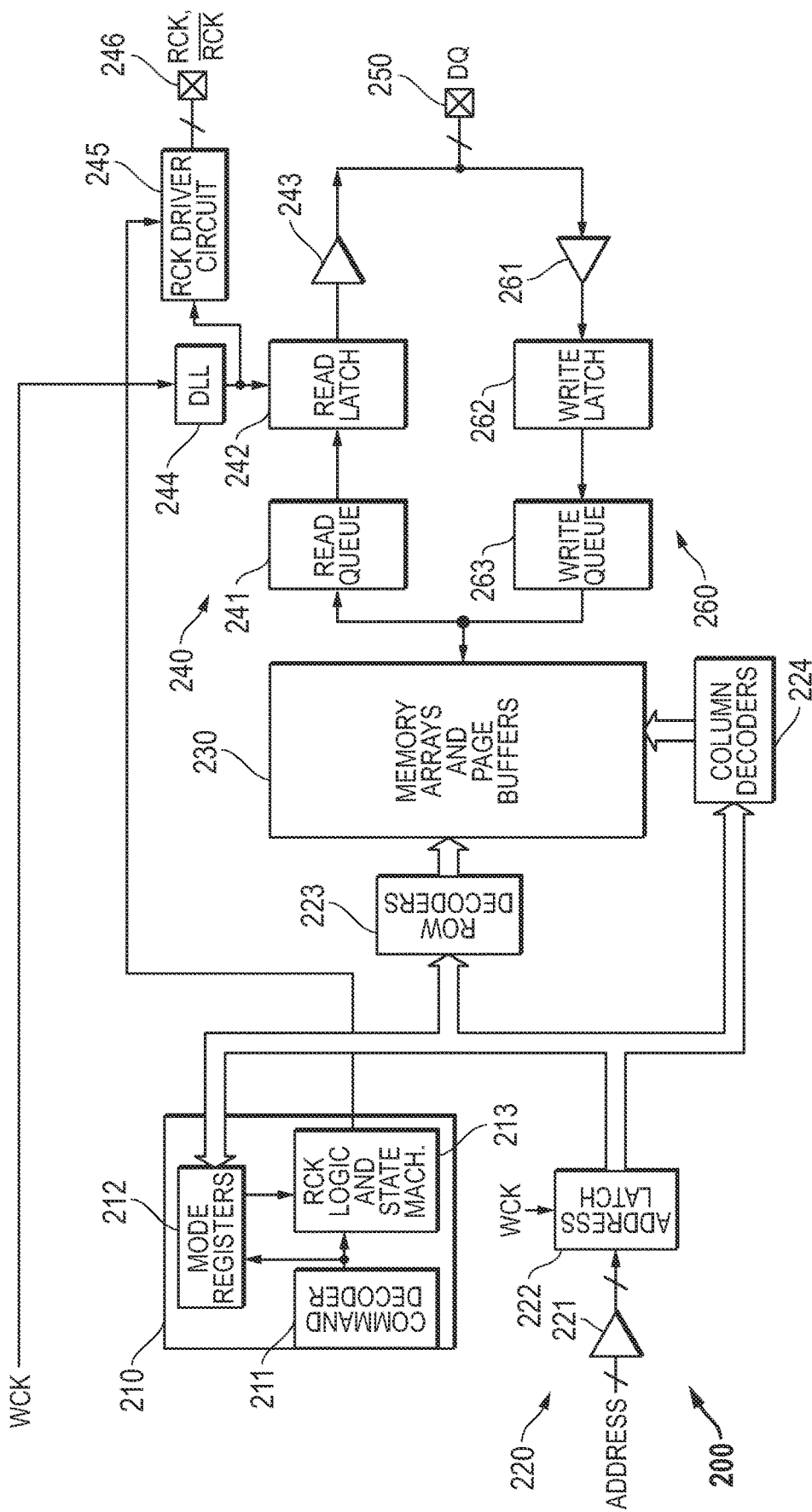
FIG. 2 illustrates in block diagram form the GDDR DRAM of FIG. 1 according to some embodiments.

FIG. 2 illustrates in block diagram form GDDR memory 200 of FIG. 1 according to some embodiments. GDDR memory 200 generally includes a control circuit 210, an address path 220. a memory array and page buffers 230, and a data read path 240, a set of bond pads 250, and a data write path.

Control circuit 210 includes a command decoder 211, mode registers 212, and an RCK logic and state machine 213. Command decoder 211 decodes commands received from command and address pins (not shown in FIG. 2) into one of several supported commands defined by the memory's command truth table. One type of command decoded by command decoder 211 is a mode register set (MRS) command. The MRS command causes the command decoder to provide settings to the indicated mode register in which the settings are contained on the ADDRESS inputs. MRS commands have been known in the context of DRAMs for quite some time, and vary between different GDDR DRAM versions. Mode registers 212 store the programmed settings, and in some cases, output information about the GDDR DRAM. RCK logic and state machine 213 has a first input connected to the output of command decoder 211, a second input connected to certain outputs of mode registers 212, and an output. As will be described further, RCK logic and state machine 213 further processes a read clock flag. The read clock flag indicates, on the fly, the read clock behavior after the read postamble period, i.e., during the "inter-amble" period. The read clock flag can be encoded with the command signals, with a separate signal, or in any other known way.

Address path 220 receives a multi-bit ADDRESS signal, and includes an input buffer 221 and an address latch 222 for each address signal, a set of row decoders 223, and a set of column decoders 224. Input buffer 221 receives and buffers the corresponding multi-bit ADDRESS signal, and provides a multi-bit buffered ADDRESS signal in response. Address latch 222 has an input connected to the output of input buffer 221, an output, and a clock input receiving a signal labelled "WCK". Address latch 222 latches the bits of the buffered address on a certain clock edge, e.g., the rising edge, and functions not only as a write clock during write commands, but also as a main clock that is used to capture commands. Row decoders 223 have an input connected to the output of address latch 222, and an output. Column decoders 224 have an input connected to the output of address latch 222, and an output.

Memory arrays and page buffers 230 are organized into a set of individual memory arrays known as banks that are separately addressable. For example, GDDR memory 200 may have a total of 16 banks. Each bank can have only one "open" page at a time, in which the open page has its contents read into a corresponding page buffer for faster read and write accesses. Row decoders 223 select a row in the accessed bank during an activate command, and the contents of the indicated row are read into the page buffer and the row is ready for read and write accesses. Column decoders 224 select a column of the row in response to a column address.

Data read path 240 includes a read queue 241, a read latch 242, an output buffer 243, a delay locked loop (DLL) 244, and an RCK and $\overline{RCK}$ pins. Read queue 241 has an input connected to an output of memory arrays and page buffers 230, and an output. Read latch 242 has in input connected to the output of read queue 241, a clock input, and an output. Buffer 243 has an input connected to the output of read latch 242, and an output connected to bond pads 250. FLL 244 has an input receiving a write clock signal labelled "WCK), and an output connected to the clock input of read latch 242. RCK driver circuit 245 has an input connected to the output of DLL 244, a control input connected to the output of RCK logic and state machine 213, and an output connected to the RCK and $\overline{RCK}$ pins.

Write data path 260 includes an input buffer 261, a write latch 262, and a write queue 263. Input buffer 261 has an input connected to a set of bond pads 250 labelled "DQ", and an output. Write latch 262 has in input connected to the output of input buffer 261, and an output. Write queue 263 has an input connected to the output of write latch 262, and an output connected to memory arrays and page buffers 230.

In operation, GDDR memory 200 allows concurrent operations in the memory banks and in one embodiment, GDDR memory 200 is compatible with one of the double data rate (DDR) standards published by the Joint Electron Device Engineering Council (JEDEC), such as the newly emerging graphics DDR, version 7 (GDDR7) standard. In order to access data, a memory accessing agent such as GPU 110 activates a row in a memory bank by issuing an activate ("ACT") command. In response to the ACT command, data from memory cells along the selected row are stored in a corresponding page buffer. In DRAMs, data reads are destructive to the contents of the memory cells, but a copy of the data is stored in the page buffer. After memory controller 114 finishes accessing data in the selected row of a bank, it closes the row by issuing a precharge ("PRE") command (or write or read command with auto-precharge, or a precharge all command). The PRE command causes the data in page buffer 124 to be rewritten to its row in the selected bank, allowing another row to then be activated. These operations are conventional in DDR memories and described in the various JEDEC standard documents and will not be described further.

According to various embodiments disclosed herein, however, GDDR memory 200 includes a modified set of mode registers 212 that, compared to existing standards such as GDDR6, adds mode register fields that can be used to define the behavior of the RCK signal that memory 200 provides along with accessed data during a read cycle. In addition, memory 200 includes RCK logic and state machine 213 to control the output of the RCK (and optionally $\overline{RCK}$) signals according to the behavior specified in mode registers 212.

FIG. 3 illustrates a table 300 showing a mode register setting for the read clock modes of the memory of FIG. 2. Table 300 shows a value of different bits or bit fields of a 12-bit mode register, in which the twelve bits correspond to address signals by which the mode registers are loaded. Table 300 has six columns, including an OP code (operational code) column corresponding to certain bit or bits of the mode register, a Function column identifying the function defined by the corresponding bits, an OP code Value column specifying the different values of the OP code, and a Description column identifying the meaning of the different OP code values.

Mode register bits [1:0] are labelled "RCKMODE" and identify the selected RCK mode. A value of 00b (binary) identifies the Disabled mode, in which the RCK is not provided by memory 200. This mode is the default mode.

A value of 01b indicates the Read Only mode. As will be described further below, in the Read Only mode, RCK is provided during one or more read cycles and each read cycle contains both a preamble and a postamble. When Read Only mode is selected, an interamble behavior is defined when consecutive reads are separated by more than the minimum amount of spacing, i.e., by at least $t_{CCD}+1$ RCK cycles, in which $t_{CCD}$ is the minimum command-to-command delay time. In general, during the Read Data mode, the RCK starts a preamble period before the transfer of data in a read cycle, and ends a preamble period after a read cycle. In particular, it starts toggling coincident with data transfer for a read command (RD), a read with auto-precharge command (RDA), and with a read training (RDTR) command. It stops with a clear condition. In some embodiments, the clear condition includes receipt of a write command (a write command (WR), a write with auto-precharge command (WRA), or a write training (WRTR) command), receipt of an all banks idle state indication, or entry into a power down state.

A value of 10b indicates an Always Running mode. In the Always Running mode, RCK runs continuously as long as WCK, used to generate RCK, is received by memory 200.

A value of 11b is reserved (RSVD) but allows the definition of a new mode of providing the RCK signal to be added in the future using this mode register structure.

Mode register bit [2] defines a read clock type (RCKTYPE). A value of 0b indicates that GDDR memory 200 provides the RCK signal as a single-ended signal, i.e., $\overline{RCK}$ does not toggle. A value of 1b indicates that the both the RCK and the $\overline{RCK}$ signals toggle as a differential signal.

Mode register bits [4:3] define the length of the static preamble period. To allow a memory controller to lock to the preamble, each preamble period has a static period, a low-speed period, and a high-speed period. In the example preamble signals of FIG. 3 and FIG. 4, the static states 304 and 404 represent a static period, the initial toggling states 306 and 406 represent a low speed period, and the final toggling states 308 and 408 represent a high-speed period. During the static period, the read clock signal is driven in its inactive state, i.e., RCK is driven low and $\overline{RCK}$ is driven high. A value of 00b indicates a static period of 0 clock cycles, i.e., no static period. Values of 01b, 10b, and 11b define static periods of 2, 4, and 6 cycles, respectively.

Mode register bit [5] defines an RCK level setting (RCK-LEVEL), which in this example provides for two possible value pairs of the RCK levels during the RCK preamble and RCK operation. A value of 0b defines +3/−3 values for the RCK signal's PAM driver, and a value of 1b defines values of +1/−1. While these value pairs are shown as an example, in various embodiments configuration settings can be used to program any desired pair of values, including defining different pairs of values in each phase of the preamble.

Mode register bits [7:6] define the length of the high-speed preamble period. A value of 00b indicates a high-speed preamble period of 0 clock cycles, i.e., no high-speed preamble period. Values of 01b, 10b, and 11b define static periods of 2, 4, and 6 cycles, respectively.

Mode register bit [8] is not defined and is as reserved for future use (RFU).

Mode register bits [10:9] define the length of the low-speed preamble period. A value of 00b indicates a low-speed preamble period of 0 clock cycles, i.e., no low-speed preamble period. Values of 01b, 10b, and 11b define static periods of 1, 2, and 3 cycles. Note that while the high-speed and low-speed preamble periods are independently programmable, if OP code bits [7:6] and [10:9] have the same values, then the high-speed and low-speed preambles are the same lengths of time.

Mode register bit [11] is not defined and is shown as RFU.

It should be apparent that these mode register encodings are just one possible way to encode these values, and other encodings are possible. For example, instead of using a dedicated more register, these bits can be distributed among multiple mode registers, for example in otherwise unused or reserved bit positions.

Figure 4:
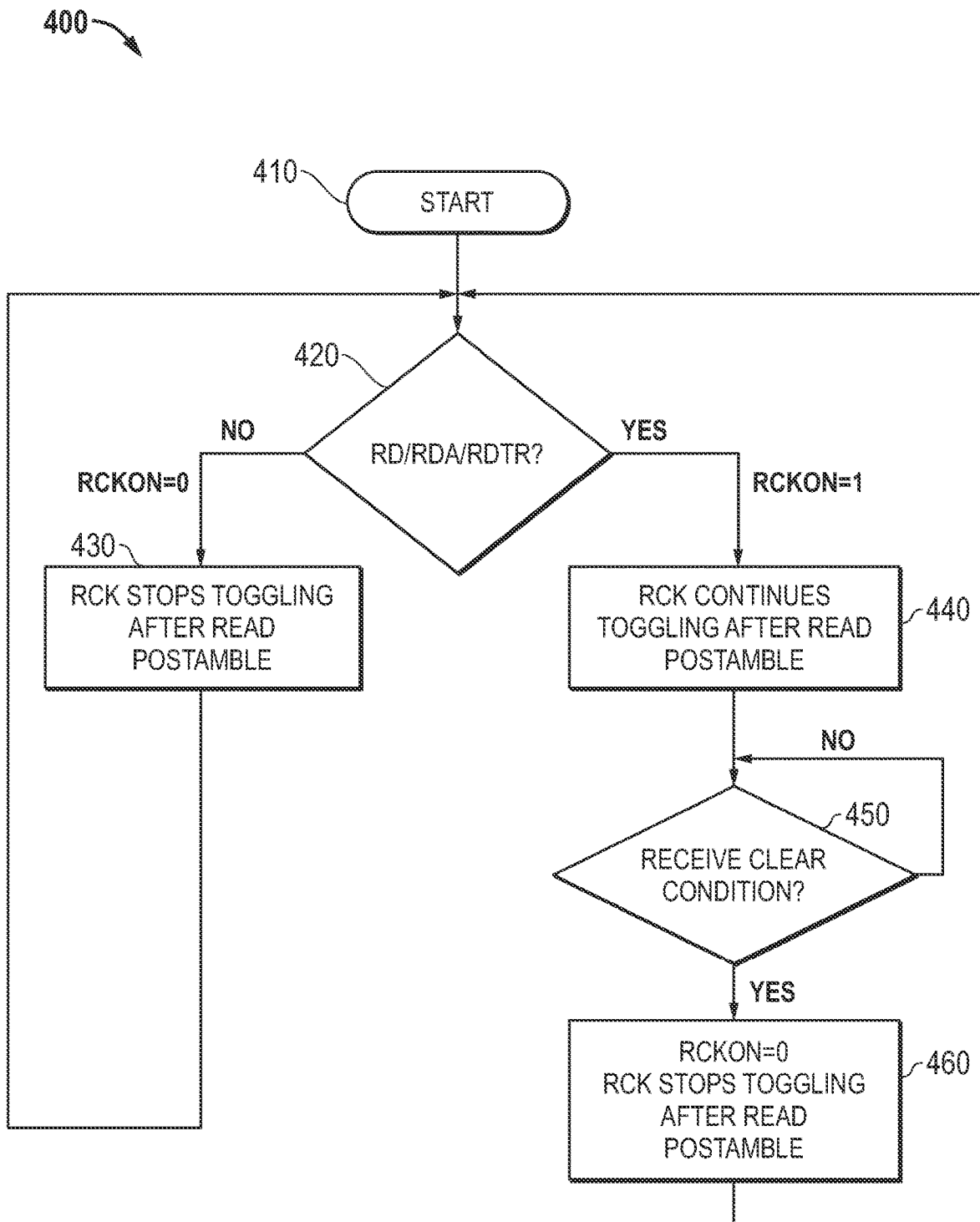
FIG. 4 illustrates a flow chart useful in understanding the operation of the memory of FIG. 2 according to some embodiments.

FIG. 4 illustrates a flow chart 400 useful in understanding the operation of memory 200 of FIG. 2 according to some embodiments. Flow chart 400 governs the start and stop behavior and the inter-amble behavior of RCK when RCKMODE is set to Read Only. Flow chart 400 defines a flag known as the RCKON flag.

Flow starts in action box 410 when a first command is received. A decision box 420 determines whether the command is a read command (such as one of a read command (RD), read with auto-precharge command (RDA), or read training (RDTR) command) and if so the state of the RCKON flag. If the command is not a read command, or if it is a read command and the RCKON flag is cleared, then flow proceeds to action box 430. In action box 430, RCK stops toggling after the read postamble period.

If the command is a read command and the RCKON state variable is set to 1, then flow proceeds to action box 440. In action box 440, memory 200 continues to toggle the RCK signal after the postamble period for the read command. From this point on, the state of the RCKON becomes a don't-care. Flow proceeds to a decision box 450, which determines whether a clear condition has been received. In some embodiments, the clear condition includes one or more of receiving an explicit read clock stop command by memory 200, receiving a write command (e.g., any one or more of a write command (WR), a write with auto-precharge command (WRA), or a write read training (WRTR) command) by memory 200, receiving a mode register set command by memory 200, detecting an all-banks idle condition by memory 200, and detecting a power down condition of memory 200. If a clear condition is not received, then flow returns to decision box 450. If a clear condition is received, then flow proceeds to action box 460. In action box 460, the state variable RCKON is cleared to 0, and RCK stops toggling after the read postamble, and flow returns to decision box 420.

Figure 5:
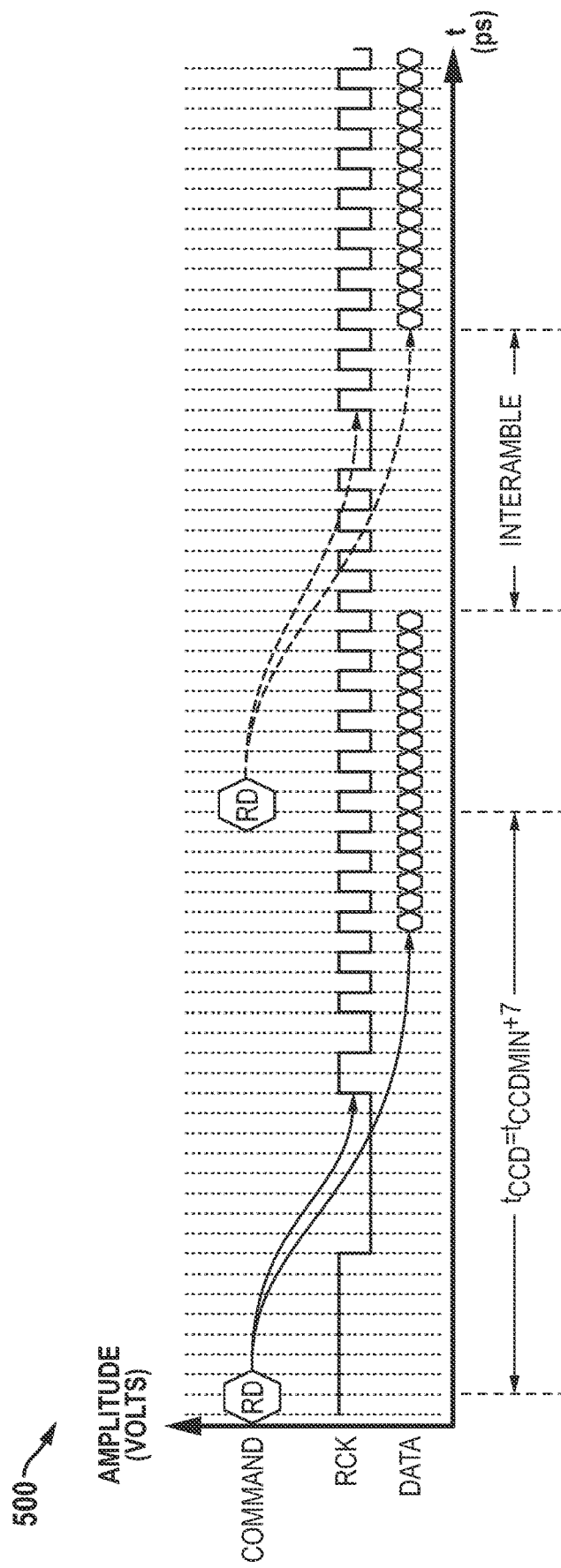
FIG. 5 is a timing diagram showing properties of the receive clock timing of the memory of FIG. 2 according to some embodiments.

FIG. 5 illustrates a timing diagram 500 showing properties of the receive clock timing of memory 200 of FIG. 2 according to some embodiments. In timing diagram 500, the horizontal axis represents time in picoseconds (ps), and the vertical axis represents the amplitude of various signals in volts. Shown along the vertical axis are three signals or signal groups of interest: a COMMAND signal, an RCK signal, and a DATA signal. Dashed lines show low-to-high and high-to-low transitions of the RCK signal and correspond to various time points.

In the example shown in timing diagram 500, mode register 300 has been programmed for RCKMODE=Read Only, RCKTYPE=Single Ended, RCKPRE_Static=4, RCKPRE_LS=1, and RCKPRE_HS=2. Timing diagram 500 shows the issuance of a read command labelled "RD" at the second RCK transition, with the RCKON attribute set to 1. Because of the read latency, memory 200 does not provide the read data until the twenty-fifth clock cycle. Thus, prior to this RCK cycle, memory 200 provides a preamble as defined in table 300.

In this example, the burst length is 16, and memory 200 can accept another command at $t_{CCDMIN+1}$, but doesn't actually issue it until $t_{CCDMIN+7}$, creating the need to define interamble behavior. As seen here, the interamble is a combination of the continuous toggling RCK after the last data transmission of the first cycle, followed by a low period of the low speed preamble of the second ready cycle, followed by high speed toggling of the preamble of the high-speed portion.

Figure 6:
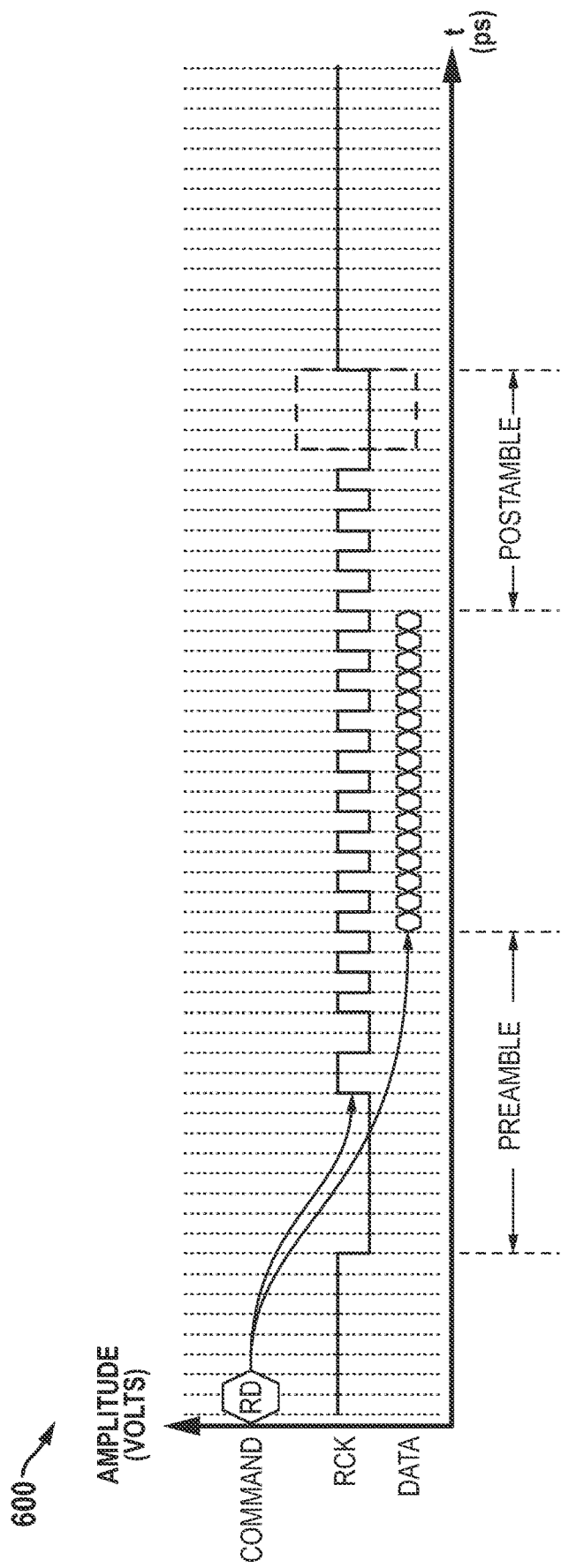
FIG. 6 is a timing diagram showing further properties of the receive clock timing of the memory of FIG. 2 according to some embodiments.

FIG. 6 is a timing diagram 600 showing further properties of the receive clock timing of memory 200 of FIG. 2 according to some embodiments. In timing diagram 600, the horizontal axis represents time in picoseconds (ps), and the vertical axis represents the amplitude of various signals in volts. Shown along the vertical axis are the COMMAND signal, the RCK signal, and the DATA signal as previously described. Dashed lines show low-to-high and high-to-low transitions of the RCK signal and correspond to time points designated "$t_1$" through "$t_{68}$".

In the example shown in timing diagram 600, mode register 300 has been programmed for RCKMODE=Read Only, RCKTYPE=Single Ended, RCKPRE_Static=4, RCKPRE_LS=1, and RCKPRE_HS=2. Timing diagram 600 shows the issuance of a read command RD at $t_2$ with RCKON=0 and in which RCKON has not been previously set since a prior clear condition. In this case, the RD command causes memory 200 to issue a preamble as defined in the mode register, perform the read burst cycle with RCK toggling, and follow the read burst cycle by a postamble. In this case, the postamble includes a trailing static portion of two clock cycles to end the postamble period. Thus, when the RCKMODE=Read Only, the host processor can convert RCK and $\overline{RCK}$ into a read only toggling dynamically during operation according to the RCKON setting. If instead RCKTYPE=Differential, then before the preamble period, both RCK_t and RCK_c would be high due to not being driven by GDDR memory 200 but pulled high by GDDR PHY 116, and RCK_t would be driven low during the preamble while RCK_c would remain high, until they subsequently started to toggle.

Figure 7:
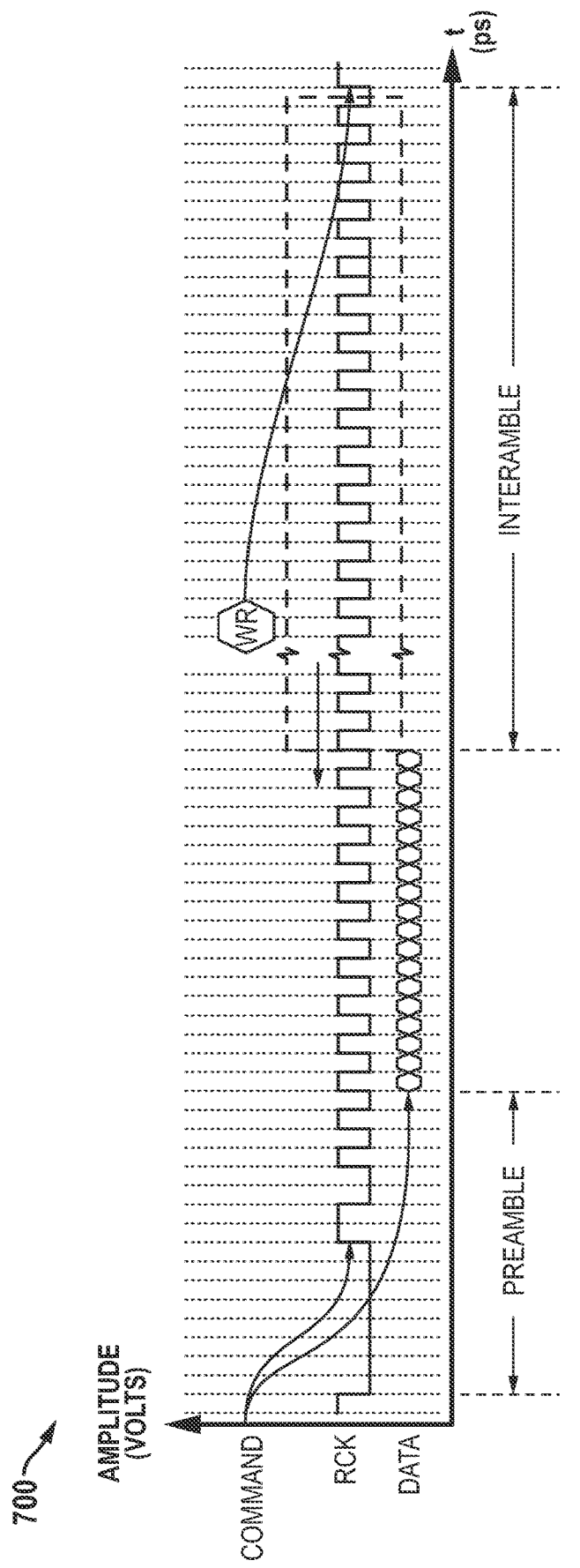
FIG. 7 is a timing diagram showing yet further properties of the receive clock timing of the memory of FIG. 2 according to some embodiments.

FIG. 7 is a timing diagram 700 showing yet further properties of the receive clock timing of memory 200 of FIG. 2 according to some embodiments. In timing diagram 700, the horizontal axis represents time in picoseconds (ps), and the vertical axis represents the amplitude of various signals in volts. Shown along the vertical axis are the COMMAND signal, the RCK signal, and the DATA signal as previously described. Dashed lines show low-to-high and high-to-low transitions of the RCK signal and correspond to various time points.

In timing diagram 700, memory 200 receives a RD command with an RCKON attribute set to 1 at a point in time before the times shown in timing diagram 700. Memory 200 provides a preamble for the RCK signal in response to the RD command. However, after the end of the transfer of data, memory 200 continues to toggle the RCK signal which, in the example of timing diagram 700, forms an extended interamble period. As shown in FIG. 7, before a subsequent read command is received, memory 200 receives a WR command (WR, WRA, or WRTR). In this case, RCK logic and state machine 213 decodes the write command and after a write command latency time, stops toggling the RCK signal.

By providing the capability to start and stop the RCK toggling, memory 200 provides a read clock signal that is a hybrid of a strobe and a clock signal. Memory 200 also provides a mechanism for the memory to suppress outputting the RCK continuously after a clear condition. This capability allows the DLL in the memory controller to stay locked during a streak of read commands, yet to stop toggling and save power in response to a clear condition. Memory controllers re-order commands to improve the efficiency of usage of the memory bus, and group commands of the same type of lower the frequency of bus turn-arounds from reads to writes and from writes to reads. For example, efficiency of bus usage is especially important for discrete GPUs, which users often configure to push the limits of performance. This capability provides several benefits.

First, it allows the memory controllers to operate more efficiently by simplifying their design that would otherwise be required due to the complexities of the interamble. In particular, the interamble calculations can be simplified or eliminated.

Second, it preserves signal integrity of the signals that switch when RCK is not used. For example, this mechanism allows the user to avoid the continuous generation of RCK in response to receiving a write command. Thus the write cycle is more robust, with larger timing margins to capture data in the memory because of less signal interference and cross-talk.

Third, by suppressing the switching of the RCK signal during streaks of write accesses, it saves the switching power of the high-speed signal switching of an external signal typically driven on a printed circuit board, when it is not needed.

Fourth, it provides flexibility in implementation because the host processor can set the RCKON flag used in the memory in a variety of ways. For example, the host processor can issue a mode register set command to program an unused or vender-specific RCKON bit in a mode register. It can issue an explicit RCKON command or include an RCKON attribute in a RD command encoding. It can also activate a new, dedicated signal line.

Figure 8:
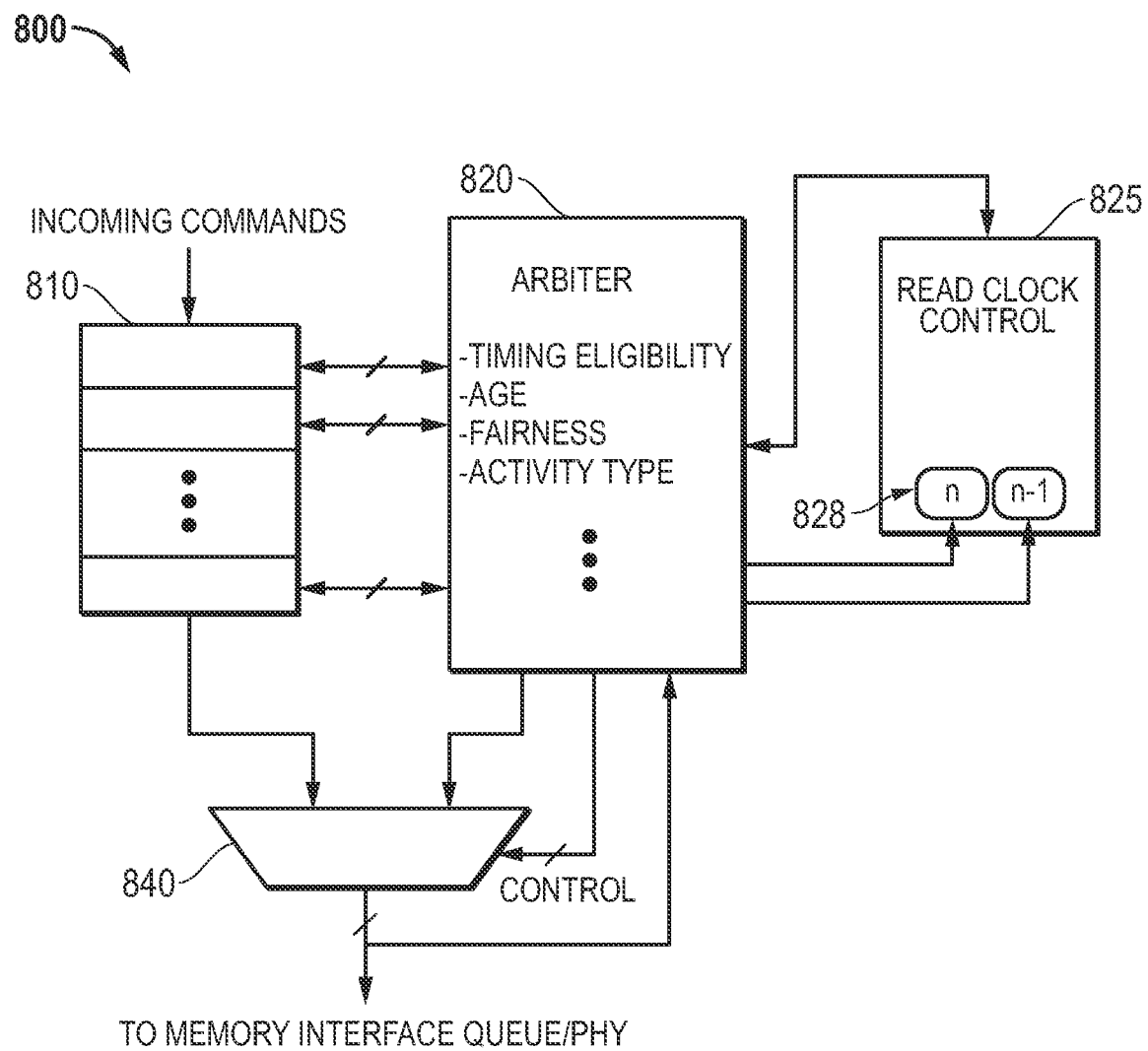
FIG. 8 illustrates in block diagram form a portion of the memory controller of FIG. 1 according to some embodiments.

FIG. 8 illustrates in block diagram form a portion 800 of memory controller 114 of FIG. 1 according to some embodiments. The depicted portion 800 is suitable for use in a memory controller for GDDR memories, and other similar DRAM types with a controllable read clock. Portion 800 includes a command queue 810, an arbiter 820 with an associated read clock control circuit 825, and a multiplexer 840. Command queue 810 stores incoming memory access request, which could be read or write cycles to any bank in the memory and are generated by any one of the memory accessing agents in data processing system 100. In the example of FIG. 8, command queue 810 has a total of 32 entries for all banks and ranks, each entry storing an access address, and a tag that indicates its relative age, and other metadata. Arbiter 820 is bidirectionally connected to each entry in command queue 810 for reading its attributes, has an additional input for receiving an access as it is dispatched, has an output for providing protocol commands such as ACT and PRE commands, and has a control output for selecting one of the thirty-two entries to send to interface 212. Multiplexer 840 has thirty-two inputs connected to respective entries of command queue 810, an additional input connected to the output of arbiter 820, a control input connected to the output of arbiter 820, and an output for providing a dispatched access to the memory PHY.

Read clock control circuit 825 has a bidirectional connection to arbiter 820, and a number of inputs connected to respective outputs of arbiter 820. Read clock control circuit 825 includes multiple command entries 828, for tracking currently selected commands and at least one command available for selection (labeled "n" and "n−1", respectively), and read clock control logic for implementing the tracking functions as described below. In various implementations, read clock control circuit 815 is typically implemented with the arbiter's command selection logic for tracking available commands.

In operation, read clock control circuit 825 receives indicators from arbiter 820 when read commands are selected for dispatch to the memory interface queue, and generally checks for a designated condition that are used to control the behavior of RCK as further described below with respect to FIG. 9. In embodiments in which the read clock is controlled with flags or tags associated with the read commands, read clock control circuit 425 updates the tags in command queue 410 to set a designated value for the tag to specify a mode for the read clock.

Command queue 810 stores incoming accesses and assigns a tag to indicate a command's relative age. Arbiter 820 determines which pending access in command queue 810 to schedule and dispatch to the memory interface queue 214 based on a set of policies such a timing eligibility, age, fairness, and activity type. Arbiter 820 includes a page table, not shown in FIG. 8, to indicate open pages in each bank and rank of the memory system. In general, arbiter 820 can increase the efficiency of the memory system bus by scheduling streaks of commands, which include multiple accesses to the same row together, while delaying an older access to a different row in the same bank. Control of the read clock mode is particularly advantageous during streaks of read commands, which may include sending multiple read commands to multiple open rows in various memory banks.

Figure 9:
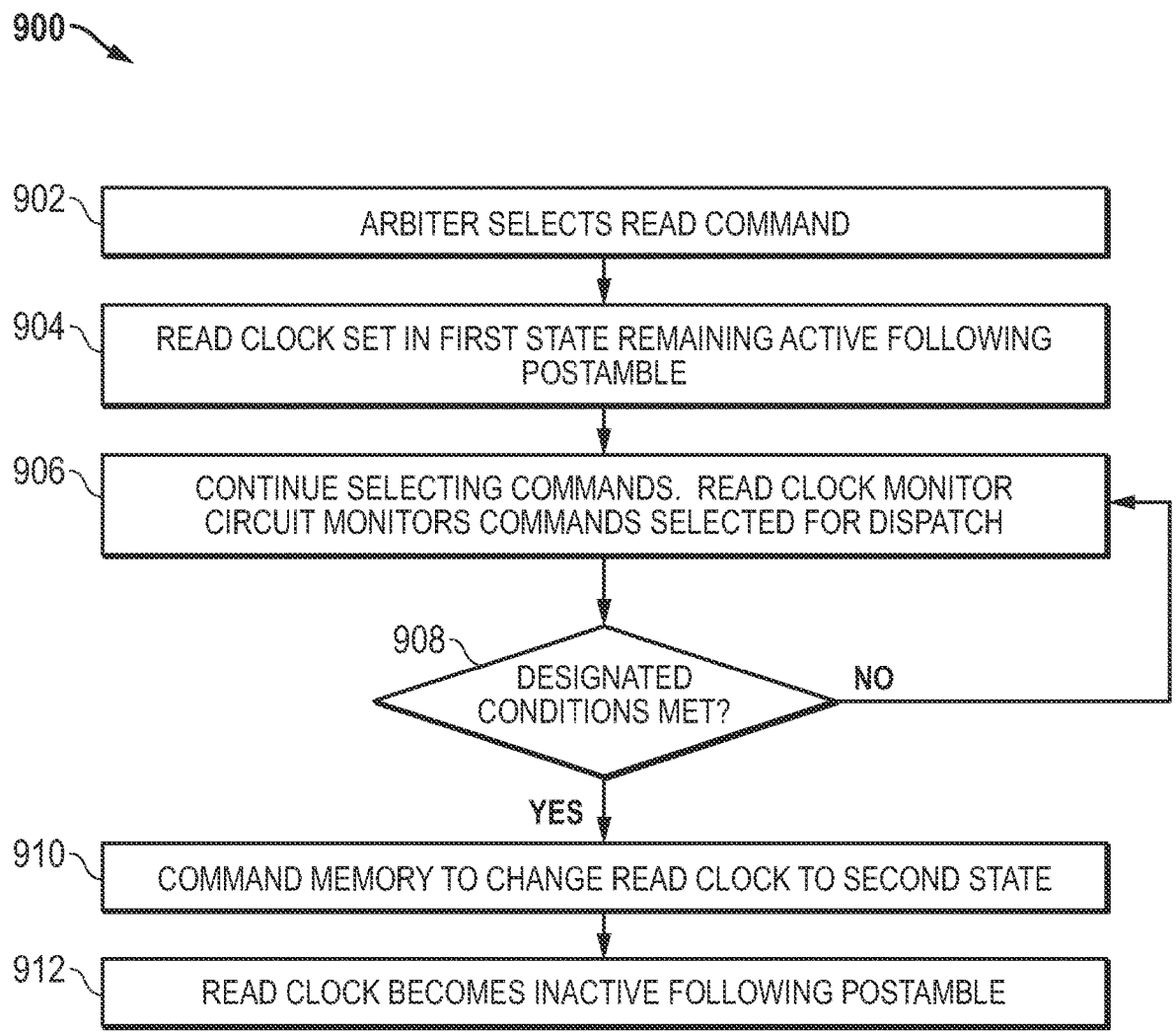
FIG. 9 shows a flow diagram of a process for operating a read clock according to some embodiments In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

FIG. 9 shows a flow diagram 900 of a process for operating a read clock according to some embodiments. It is noted that the illustrated process is only one suitable way to operate a controllable read clock. The read clock may also be left in a "read only" state in which the clock is deactivated following each postamble. However, such a state is often not suitable for scenarios in which the arbiter selects multiple read commands in a sequence, often referred to as a streak. In such cases, the postamble period for the read clock may overlap with the preamble period for the next read clock. Further, in scenarios in which read commands are not separated by write commands, but by ACT or other commands, it may be advantageous to allow the read clock to stay active after a postamble period. The depicted process provides a technique for control of the read clock from a memory controller to achieve such functionality.

At block 902, the process starts when arbiter 820 selects a read command for dispatch to a memory which includes controllable read clock as described above. At block 904, the read clock is set in a first state in which it will remain active following a postamble after the read command has been fulfilled. This may be done with an explicit command or by indicating the command by a read clock flag accompanying the read command sent at block 902. In this implementation, the process assumes the first selected read command will be part of a streak or another situation for which it is beneficial to leave the read clock activated between read commands. In other implementations, a process may first check whether the read command is expected to be part of a streak, for example by checking if other read commands are available to be selected by the arbiter to open pages in the memory.

At block 906, the process continues selecting commands for dispatch to the memory. The read clock monitor circuit monitors the commands selected for dispatch to determine whether to the change the state of the read clock. As shown at block 908, if the designated condition is met, the process goes to block 910 where it commands the memory to change the read clock to a second state. If the designated condition is not met at block 908, the process continues selecting commands at block 906, leaving the read clock in the first state.

In some embodiments, the read clock control circuit commands the memory to change the state of the read clock by setting a read clock flag associated with a current read command to a designated value. It is noted that a read clock flag may be included with each read command. In such implementations, the read clock flag value for the first state may be repeated with each command selected at block 906. Then, when the read clock state is desired to be changed, the read clock flag value for the current command is changed to a new designated value indicating the second state at block 910. In other implementations, a separate command may be issued to the memory to change the read clock state at blocks 904 and 910.

Referring to block 908, in some implementations, the designated condition is that a gap of at least a predetermined size will appear between a current read command dispatched to the memory and a subsequent read command to be dispatched to the memory. For example, a write command separating two read commands may meet the designated condition. In such case, the read clock would be deactivated following the preamble period to avoid causing signal interference for write data transmitted to the memory. However, if a single command that is not a write command separates two read commands, the designated condition may not be met in some implementations. In some implementations, the designated condition is that at least a designated number of write commands will appear between a current read command dispatched to the memory and a subsequent read command to be dispatched to the memory. In some implementations, the designated condition is that a current read command is a final command in a streak of read commands selected by the arbiter. Furthermore, while a "designated condition" is referred to, this may include a combination of conditions, or more than one alternate condition.

Following the command to change the read clock to the second state at block 910, the process goes to block 912 where memory receives the command and implements it, changing the read clock state to inactive following the postamble period for the current read command.

A memory or portions thereof described herein can be embodied one or more integrated circuits, any of which may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, host processors can use various techniques of setting the read clock on attribute (RCKON) such as explicit commands, unused bits in the command encoding, setting a mode register, and the like. While the RCK programming was described in the context of a GDDR memory, another type of circuit, integrated or discrete, can use a clock signal with a hybrid behavior that was described for the RCK signal. The RCK signal can be used in other types of memory as well, including DDR and high-bandwidth (HBM) memory. Moreover, various levels of granularity of preamble and postamble behavior can also be supported. The bits that define the supported RCK mode can be defined in a dedicate mode register, or can be set is various bit positions in different mode registers. These bit positions may have been previously unused and reserved for future use, or dedicated to customer-specific use.

Accordingly, it is intended by the appended claims to cover all modifications of the disclosed embodiments that fall within the scope of the disclosed embodiments.

What is claimed is:

1. A memory controller, comprising:
 a command queue including a plurality of entries for holding incoming memory access commands;
 an arbiter for selecting commands from the command queue for dispatch to a memory; and
 a read clock control circuit for monitoring read commands selected for dispatch to the memory, and responsive to a designated condition, commanding the memory to change a state of a read clock from a first state in which the read clock remains active following a postamble period for a read command, to a second state in which the read clock becomes inactive following the postamble period.

2. The memory controller of claim 1, wherein:
 said designated condition is that a gap of at least a predetermined size will appear between a current read command dispatched to the memory and a subsequent read command to be dispatched to the memory.

3. The memory controller of claim 1, wherein:
 said designated condition is that at least a designated number of write commands will appear between a current read command dispatched to the memory and a subsequent read command to be dispatched to the memory.

4. The memory controller of claim 1, wherein:
 said designated condition is that a current read command is a final command in a streak of read commands selected by the arbiter.

5. The memory controller of claim 1, wherein:
said read clock control circuit commands the memory to change the state of the read clock by setting a read clock flag associated with a current read command to a designated value.

6. The memory controller of claim 1, wherein:
said read clock control circuit commands the memory to change the state of the read clock by sending an explicit command to the memory separate from a read command.

7. The memory controller of claim 1, wherein:
said read clock control circuit, responsive to the absence of said designated condition, causes read clock remains in the first state.

8. The memory controller of claim 7, wherein:
wherein causing the read clock to remain in the first state comprises setting a read clock flag associated with a current read command to a designated value.

9. A method comprising:
at a memory controller, selecting memory access commands and dispatching them to a memory;
monitoring read commands selected for dispatch to the memory; and
commanding the memory to change a state of a read clock from a first state in which the read clock remains active following a postamble period for a read command, to a second state in which the read clock becomes inactive following the postamble period.

10. The method of claim 9, wherein:
commanding the memory to change the state of the read clock is based on a designated condition, and said designated condition is that a gap of at least a predetermined size will appear between a current read command dispatched to the memory and a subsequent read command to be dispatched to the memory.

11. The method of claim 9, wherein:
commanding the memory to change the state of the read clock is based on a designated condition, and said designated condition is that at least a designated number of write commands will appear between a current read command dispatched to the memory and a subsequent read command to be dispatched to the memory.

12. The method of claim 9, wherein:
commanding the memory to change the state of the read clock is based on a designated condition, and said designated condition is that a current read command is a final command in a streak of read commands selected by the memory controller.

13. The method of claim 9, wherein:
commanding the memory to change the state of the read clock includes setting a read clock flag associated with a current read command to a designated value.

14. The method of claim 9, wherein:
commanding the memory to change the state of the read clock is based on a designated condition, and further comprising responsive to the absence of said designated condition, causing the read clock remains in the first state.

15. The method of claim 14, wherein:
wherein causing the read clock to remain in the first state comprises setting a metadata flag associated with a current read command to a designated value.

16. The method of claim 9, further comprising:
outputting a read clock signal from the memory for a read command response, wherein said outputting comprises:
toggling said read clock signal during a read preamble period;
transmitting data indicated by said read clock signal; and
toggling said read clock signal for at least a read postamble period.

17. The method of claim 16, wherein:
said toggling said read clock signal for at least said read postamble period comprises stopping said toggling after said read postamble period in response to being in said first state.

18. A data processing system comprising:
a memory; and
an integrated circuit including a data processor and a memory controller coupled to the data processor and the memory, the memory controller comprising:
a command queue including a plurality of entries for holding incoming memory access commands;
an arbiter for selecting commands from the command queue for dispatch to the memory; and
a read clock control circuit for monitoring read commands selected for dispatch to the memory, and responsive to a designated condition, commanding the memory to change a state of a read clock from a first state in which the read clock remains active following a postamble period for a read command, to a second state in which the read clock becomes inactive following the postamble period.

19. The data processing system of claim 18, wherein:
said designated condition is that a gap of at least a predetermined size will appear between a current read command dispatched to the memory and a subsequent read command to be dispatched to the memory.

20. The data processing system of claim 18, wherein:
said designated condition is that at least a designated number of write commands will appear between a current read command dispatched to the memory and a subsequent read command to be dispatched to the memory.

* * * * *